United States Patent [19]
Maley

[11] Patent Number: 5,892,371
[45] Date of Patent: Apr. 6, 1999

[54] GATE OXIDE VOLTAGE LIMITING DEVICES FOR DIGITAL CIRCUITS

[75] Inventor: Reading Maley, Stanford, Calif.

[73] Assignee: Advanced Micro Devices, Inc., Sunnyvale, Calif.

[21] Appl. No.: 599,878

[22] Filed: Feb. 12, 1996

[51] Int. Cl.[6] .............................................. H03K 19/0185
[52] U.S. Cl. ................................ 326/81; 326/68; 326/83
[58] Field of Search .................................. 326/68, 80–81, 326/83, 86, 121; 327/333; 361/56, 90–91

[56] References Cited

U.S. PATENT DOCUMENTS

| | | | |
|---|---|---|---|
| 5,243,236 | 9/1993 | McDaniel .................................. | 326/68 |
| 5,300,832 | 4/1994 | Rogers ...................................... | 326/57 |
| 5,378,943 | 1/1995 | Dennard .................................... | 326/81 |
| 5,410,267 | 4/1995 | Haycock et al. ........................... | 326/81 |
| 5,479,116 | 12/1995 | Sallaerts et al. .......................... | 326/81 |
| 5,539,334 | 7/1996 | Clapp, III et al. ........................ | 326/68 |

FOREIGN PATENT DOCUMENTS 3022618  1/1991  Japan .
WO95/28035  10/1995  WIPO .

OTHER PUBLICATIONS

Nakagome, et al., Circuit Techniques for 1.5–3.6–V Battery–Operated 64–Mb DRAM, IEEE Journal of Solid–State Circuits, vol. 26, No. 7, Jul. 1991.

*Primary Examiner*—Jon Santamauro

[57] ABSTRACT

An oxide protection circuit prevents failure of the MOS transistors in a digital device. A voltage difference at a gate oxide of a digital device does not exceed a breakdown voltage magnitude. The gate oxide protection circuit includes a plurality of transistors which turn OFF or ON when a node reaches a predetermined voltage of $V_{refp}+V_t$ or $V_{refn}-V_t$, where $V_{refp}$ and $V_{refn}$ are reference applied at a gate of a PMOS or an NMOS transistor, and $V_t$ equals a threshold voltage of the MOS transistor.

20 Claims, 4 Drawing Sheets

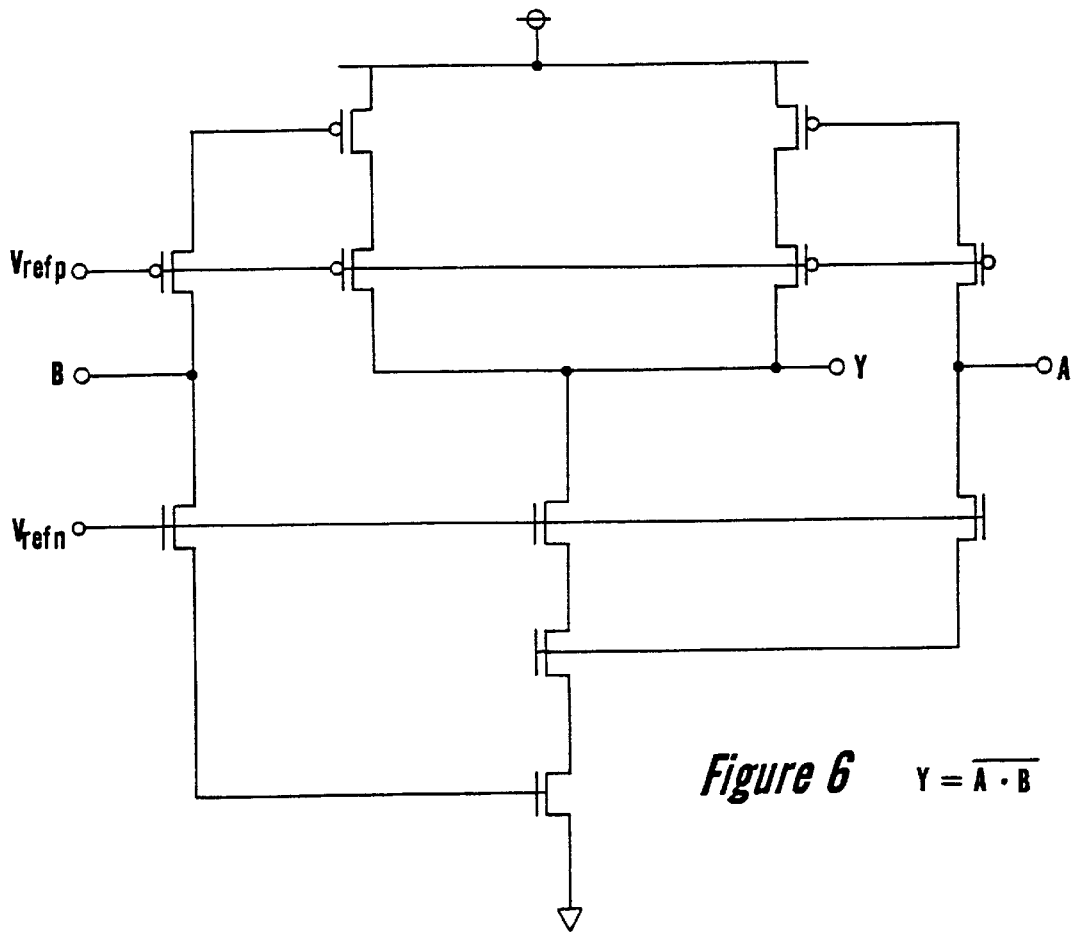
*Figure 6*  $Y = \overline{A \cdot B}$
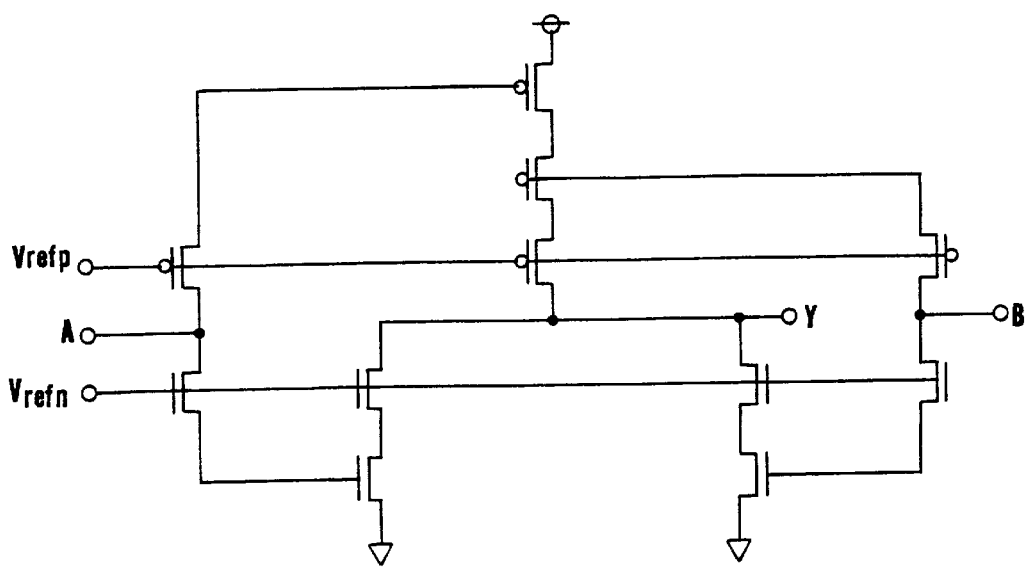
*Figure 7*  $\overline{A + B}$

5,892,371

GATE OXIDE VOLTAGE LIMITING DEVICES FOR DIGITAL CIRCUITS

TECHNICAL FIELD

The invention relates to digital devices, and more particularly, to protection circuitry for digital devices using CMOS technology.

BACKGROUND ART

To save power, the core circuitry of a device, e.g., a microprocessor, operates on a predetermined voltage level, even though the device must communicate externally using an input/output (I/O) voltage level which is higher than the predetermined voltage used by the core of the device. For example, a microprocessor operates on logic levels of high (H) and low (L) having voltage levels of 2 volts (V) and 0 V, respectively, although the device is connected to a 3.3 V power rail for use in external communications. When the core of the device outputs a signal, the device uses an I/O buffer to convert the voltage levels of 0 V and 2 V to output voltage levels of 0 V and 3.3 V.

FIG. 1 is an illustration of an inverter 2 which may be used for such a voltage conversion. A source terminal of a PMOS transistor $P_{f1}$ is connected to a predetermined source voltage $V_{CCIO}$ of 3.3 V while a source terminal of an NMOS transistor $N_{f1}$ is connected to a predetermined voltage $V_{SSIO}$ of 0V (ground voltage). The drain terminals of transistors $P_{f1}$ and $N_{f1}$ are connected to each other. The commonly connected gates of transistors $P_{f1}$ and $N_{f1}$ receive an input signal at an input terminal IN. When an input signal of 0 V from the internal device is applied at terminal IN, transistor $N_{f1}$ is turned OFF, and transistor $P_{f1}$ is turned ON such that inverter 2 outputs a signal of 3.3 V at an output terminal OUT. The inverter 2 outputs a signal of 0 V at output terminal OUT in response to an input signal of 2 V at input terminal IN.

In the latter case, however, both transistors $N_{f1}$ and $P_{f1}$ will be ON since there is a gate-source voltage $V_{gs}$ of 1.3 V, i.e., $V_{CCIO}-V_{IN}$. With both transistors $P_{f1}$ and $N_{f1}$ ON, there is a static current drain through inverter 2, undesirably consuming power as a result of static current drain.

FIG. 2 is an illustration of an inverting level shifter 4 used for voltage conversion, improved by avoiding static current flow induced power consumption. This circuit configuration is very similar to that of cross-coupled inverters with a static dc path cut off by transistor $N_{L1}$ when a high input signal is applied at input terminal IN.

The source terminals of PMOS transistors $P_{L3}$ and $P_{L4}$ are connected to the source of voltage $V_{CCIO}$. The drain terminals of PMOS and NMOS transistors $P_{L3}$ and $N_{L1}$ are connected to each other, and the drain electrodes of PMOS and NMOS transistors $P_{L4}$ and $N_{L3}$ are connected together. The gate of transistor $P_{L3}$ is connected to output terminal OUT while a gate of transistor $P_{L4}$ is connected to a drain terminal of transistor $P_{L3}$. The gate of transistor $N_{L1}$ is connected to a reference voltage $V_{refn}$, e.g., 2.0 V. The gate of transistor $N_{L3}$ and the source terminal of transistor $N_{L1}$ are connected to input terminal IN. The source terminal of transistor $N_{L3}$ is connected to the source of predetermined ground voltage $V_{SSIO}$.

When an input signal of 0 V from the internal device is applied at terminal IN, transistors $P_{L3}$ and $N_{L3}$ are turned OFF while transistors $P_{L4}$ and $N_{L1}$ are turned ON, and level shifter 4 hence outputs a voltage level of 3.3 V at terminal OUT. When an input signal of 2 V is applied at input terminal IN, transistors $P_{L3}$ and $N_{L3}$ are turned ON while transistors $P_{L4}$ and $N_{L1}$ are turned OFF, and level shifter 4 outputs a voltage level of 0 V at terminal OUT.

After the voltage conversion, the voltage level of 0 V or 3.3 V from inverting level shifter 4 is applied to an output driver circuit of the I/O buffer. FIG. 3 is a schematic diagram of a conventional output driver circuit 6 connected to a capacitative load $C_{load}$, representative of an external device connected to an output node $N_{out}$.

The source terminal of a PMOS transistor $P_{D1}$ is connected to the source of voltage $V_{CCIO}$, e.g, 3.3 V, while a source electrode of an NMOS transistor $N_{D1}$ is connected to the source of predetermined voltage $V_{SSIO}$, e.g., 0 V. The drain of transistor $P_{D1}$ is connected to the source of a PMOS transistor $P_{D2}$, and a drain of transistor $N_{D1}$ is connected to a source of an NMOS transistor $N_{D2}$. The drains of transistors $P_{D2}$ and $N_{D2}$ are connected to an output node $N_{out}$. The gate of transistor $P_{D2}$ is connected to the source of voltage $V_{SSIO}$ while a gate of the transistor is connected to reference voltage source $V_{refn}$, e.g., 2.0 V or 3.3 V. The gates of transistors $P_{D1}$ and $N_{D1}$ receive the converted voltage levels of 0 V and 3.3 V, respectively. The transistors $P_{D2}$ and $N_{D2}$ of FIG. 3 are optional. They are most often used to limit charge leakage through the device, or to lessen hot-electron caused device lifetime or performance degradation.

When an input signal of 0 V is applied to the gates of transistors $P_{D1}$ and $N_{D1}$, transistor $N_{D1}$ turns OFF while transistor $P_{D1}$ turns ON. Both transistors $P_{D2}$ and $N_{D2}$ are initially ON, but transistor $N_{D2}$ turns OFF as the voltage level at node $N_{out}$ rises to 3.3 V. When an input signal of 3.3 V is applied to the gates of transistors $P_{D1}$ and $N_{D1}$, transistor $N_{D1}$ turns ON while transistor $P_{D1}$ turns OFF. The transistor $N_{D2}$ is ON, and node $N_{out}$ drops to 0 V, which forces transistor $P_{D2}$ to turn OFF.

As shown in FIGS. 1–3, inverter 2, level shifter 4 and output driver 6 are fabricated using CMOS technology. Due to advances, such devices are becoming smaller, the thickness of the transistor gate oxides is becoming thinner. For most semiconductor processes, when the thickness of the gate oxide becomes less than or equal to approximately 60 angstroms (Å), a voltage greater than approximately 2.4 V–2.5 V across the gate oxide causes the oxide to break down. For example, if an input signal of 2.0 V is applied to the gate of transistor $N_{L3}$, level shifter 4 of FIG. 2 outputs a voltage of 0 V at the output terminal OUT, and a voltage difference of 3.3 V exists between the bulk and gate of transistor $P_{L3}$. If the gate oxide thickness is ≦60 Å, the gate oxide will break down, causing level shifter 4 to fail. Likewise, inverter 2 and output driver 6 will fail if the gate oxide thickness of the transistors is less than about 60 Å for most processes.

DISCLOSURE OF THE INVENTION

An advantage of the present invention is in providing an integrated circuit which is not susceptible to gate oxide breakdown.

A further advantage of the present invention is in providing an integrated circuit which can operate on a standard power rail.

Still another advantage of the present invention is in increasing the reliability of an integrated circuit.

Still another advantage of the present invention is in providing a means to prevent a gate oxide voltage from exceeding a break down voltage of the gate oxide of an MOS transistor.

The above and other advantages of the invention are achieved, at least in part by an integrated circuit comprising a first component having input and output nodes, and coupled to a protection device. The first component has at least one first MOS transistor receiving an input signal of first and second levels to provide an output signal of third and fourth levels to the output node. The protection device comprises at least one second MOS transistor interconnected with the at least one first MOS transistor at a first node having a voltage level between one of (a) the fourth level and a first prescribed level and (b) the third level and a second prescribed level, to prevent voltages across gate oxide layers of the first and second MOS transistors from exceeding a prescribed magnitude.

The first component may be an inverting level shifter. The gate of transistors $L_{P1}$, $L_{P2}$ and $L_{P3}$ are connected to a reference voltage $V_{refp}$, and the gates of transistors $L_{N1}$ and $L_{N2}$ are connected to a reference voltage $V_{refn}$. The transistors $L_{P3}$ and $L_{P4}$ are also connected to a source of predetermined source voltage $V_{CCIO}$, and transistor $L_{N3}$ is connected to a source of a second predetermined voltage $V_{SSIO}$.

The transistor $L_{P1}$ is connected between transistor $L_{P3}$ and an output terminal OUT_LS. The source electrode of transistor $L_{P2}$ is connected to both transistors $L_{P3}$ and $L_{P4}$. The transistor $L_{P5}$ is connected to transistor $L_{P4}$ and output terminal OUT_LS. The transistor $L_{N1}$ is connected to transistor $L_{P2}$, an input terminal IN and transistor $L_{N3}$. The transistor $L_{N2}$ is connected between output terminal OUT_LS and transistor $L_{N3}$.

During the transition of the input signal, transistors $L_{P1}$, $L_{P2}$, and $L_{L5}$ turn ON or OFF when the voltage levels at the drains of transistors $L_{L3}$ and $L_{L4}$ fall below a voltage level of $V_{refp}+V_{tp}$, where $V_{tp}$ is a threshold voltage of the PMOS transistor. Similarly, transistors $L_{N1}$ and $L_{N2}$ turn ON or OFF when the voltage levels at the drain of transistor $L_{N3}$ reach above a voltage level of $V_{refn}-V_{tn}$, where $V_{tn}$ is a threshold voltage of the NMOS transistor.

Such a protection circuit can be also applied to logic devices to design a family of gate oxide protected logic gates. For example, a gate oxide protected inverter comprises a plurality of PMOS transistors $I_{P1}-I_{P3}$ and a plurality of NMOS transistors $I_{N1}-I_{N3}$. The transistor $I_{P1}$ is serially connected to NMOS transistor $I_{N1}$, and PMOS transistors $I_{P2}$, $I_{P3}$ and NMOS transistors $I_{N2}$, $I_{N3}$ are serially connected. The gates of transistors $I_{P1}$ and $I_{P3}$ are connected to reference voltage $V_{refp}$, and the gates of transistors $I_{N1}$ and $I_{N2}$ are connected to the reference voltage $V_{refn}$. The transistors $I_{P2}$ and $I_{N3}$ are connected to voltages $V_{CCIO}$ and $V_{SSIO}$, respectively. An electrode of transistor $I_{P1}$ is connected to a gate of transistor $I_{P3}$, and an electrode of transistor $I_{N1}$ is connected to a gate of transistor $I_{N3}$. The transistors $I_{P1}$, $I_{P3}$ and transistors $I_{N1}$, $I_{N2}$ switch ON and OFF, or vice versa, to limit the drain voltages of transistors $I_{P2}$ and $I_{N3}$, respectively, when an electrode of the PMOS transistor or the NMOS transistor reaches a voltage level of $V_{refp}+V_{tp}$ or $V_{refn}-V_{tn}$, respectively.

A gate oxide protected I/O buffer can be designed using first and second gate oxide protected inverting level shifters, first and second gate oxide protected inverters and a gate oxide protected output driver circuit. The input nodes of the first and second level shifters receive a data signal from an internal logic gate of the digital device, and the output terminals of the first and second level shifters are connected to the input terminals of the first and second inverters, respectively.

The output driver circuit comprises serially connected first and second PMOS transistors $D_{P1}$ and $D_{P2}$ and first and second NMOS transistors $D_{N1}$ and $D_{N2}$. The source electrode of PMOS transistor $D_{P1}$ is connected to a predetermined power voltage $V_{CCIO}$ while a source electrode of NMOS transistor $D_{N1}$ is connected to a predetermined voltage $V_{SSIO}$. The drains of transistors $D_{P2}$ and $D_{N2}$ are connected to an output node $C_{out}$. The gate of transistor $D_{P1}$ is connected to the first inverter at a first node while the gate of transistor $D_{N1}$ is connected to the second inverter at a second node.

The transistors $D_{P2}$ and $D_{N2}$ protect transistors $D_{P1}$ and $D_{N1}$ while protecting themselves at the same time. During the transition to a high data signal, transistor $D_{P2}$ turns itself OFF when the voltage at its source reaches $V_{refp}+V_{tp}$. During the transition to a low data signal from the internal device, transistor $D_{N2}$ turns itself OFF when the voltage at its drain reaches $V_{refn}-V_{tn}$.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF DRAWINGS

The invention will be described in detail with reference to the following drawings in which like reference numerals refer to like elements wherein:

FIG. 6 is an example of an overvoltage NAND gate using the oxide protection scheme of the present invention;

FIG. 7 is an example of an overvoltage NOR gate using the oxide protection scheme of the present invention.

BEST MODE OF CARRYING OUT THE INVENTION

Figure 1:
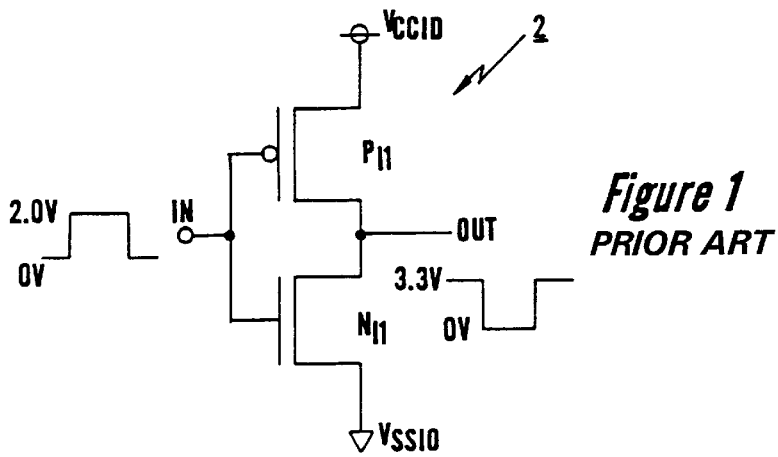
FIG. 1 is an illustration of a conventional inverter.
Figure 2:
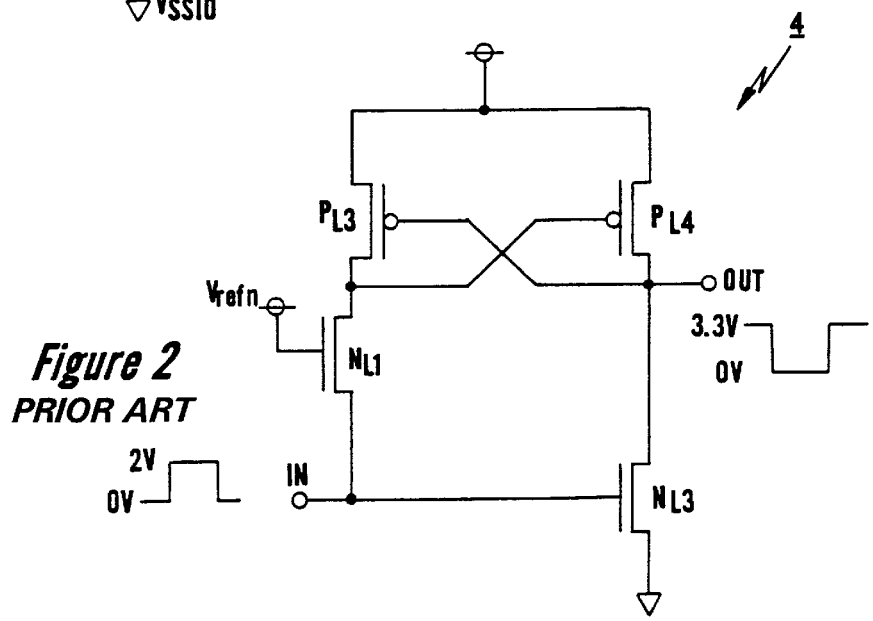
FIG. 2 is a schematic diagram of a conventional inverting level shifter.
Figure 3:
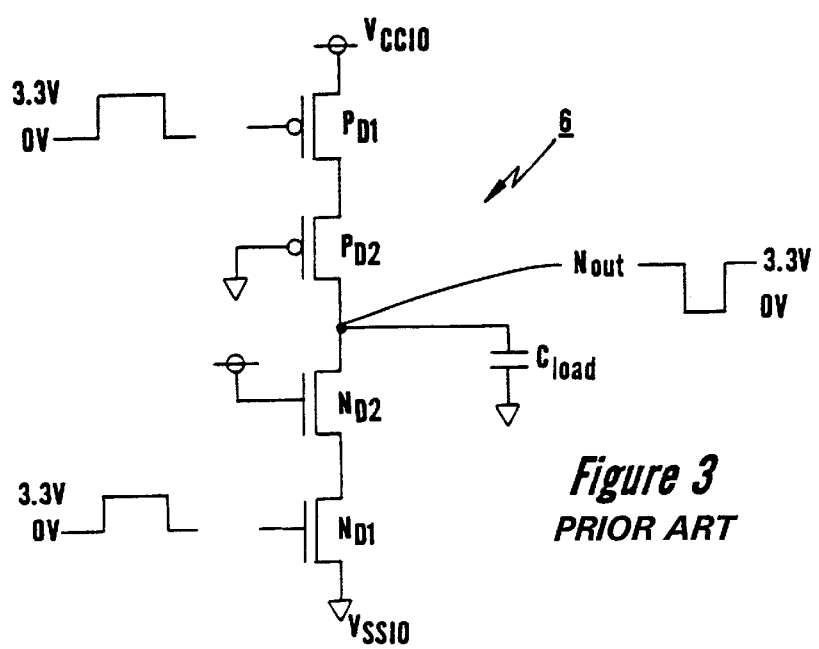
FIG. 3 shows a schematic diagram of a conventional output driver circuit of an input/output buffer.
Figure 4:
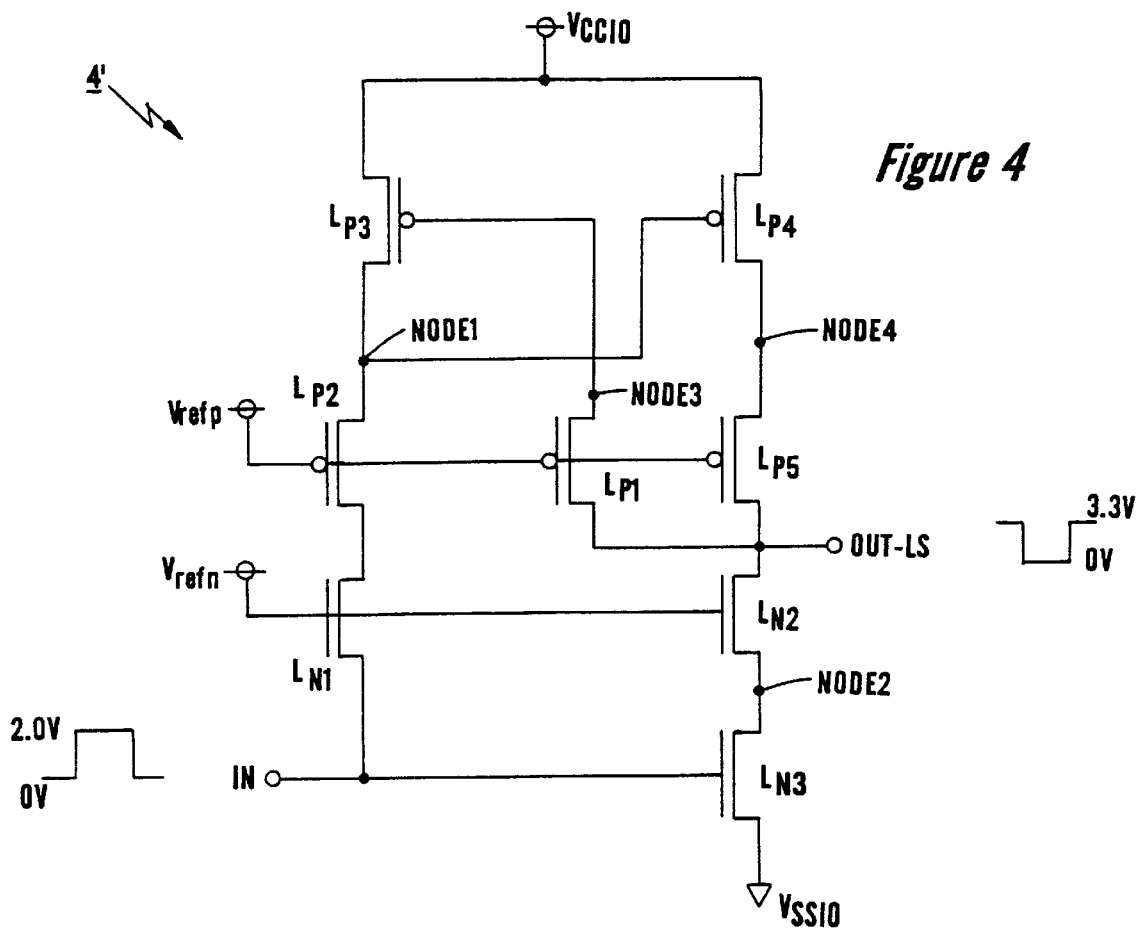
FIG. 4 depicts a gate oxide voltage limited inverting level shifter in accordance with the present invention.

FIG. 4 illustrates a gate oxide voltage limited inverting level shifter 4' of the present invention. In addition to transistors $L_{N1}$, $L_{N3}$, $L_{P3}$ and $L_{P4}$, level shifter 4' includes PMOS transistors $L_{P1}$, $L_{P2}$ and $L_{P5}$ and NMOS transistor $L_{N2}$, which prevent the gate oxide voltage of any transistor from exceeding a breakdown voltage. For example, if the thickness of the gate oxides is approximately 60 Å, the voltage difference at any gate oxide of level shifter 4' does not exceed approximately 2.5 V.

The source of transistor $L_{P2}$ is connected to the drain of transistor $L_{P3}$ and the gate of transistor $L_{P4}$, and the drain of transistor $L_{P2}$ is connected to the drain of transistor $L_{N1}$. The source of transistor $L_{P5}$ is connected to the drain of transistor $L_{P4}$, and the drain is connected to output terminal OUT_LS. The gates of transistors $L_{P1}$, $L_{P2}$ and $L_{P5}$ are connected to a reference voltage $V_{refp}$. The transistor $L_{N2}$ includes a source connected to a drain of transistor $L_{N3}$, and a drain connected to output terminal OUT_LS. Like transistor $L_{N1}$, the gate of transistor $L_{N2}$ is connected to a reference voltage $V_{refn}$.

The transistor $L_{P1}$ is connected between the gate of transistor $L_{P3}$ and output terminal OUT_LS while the gate is connected to reference voltage $V_{refp}$. Since the drain and source location depends on the current direction, the drain and source of transistor $L_{P1}$ will switch depending on whether the output signal at terminal OUT_LS is rising or falling. If the output signal is falling, a node NODE3 will become a source electrode, whereas, if the output signal is rising, node NODE3 will become a drain electrode.

To protect all gate oxides from exceeding the oxide break down voltage, transistors $L_{P1}$, $L_{P2}$, $L_{L5}$, $L_{N1}$ and $L_{N2}$ turn ON or OFF when the voltage levels at odes NODE1, NODE2, NODE3 and NODE4 reach voltages $V_{p1}=(V_{refp}+V_{tp3})$, $V_{p2}=(V_{refn}-V_{tn2})$, $V_{p3}=(V_{refp}+V_{tp1})$ and $V_{p4}=(V_{refp}+V_{tp4})$, respectively, where $V_{tp3}$, $V_{tp1}$, $V_{tn2}$ and $V_{tp4}$ represent the threshold voltages of transistors $L_{P3}$, $L_{p1}$, $L_{N3}$ and $L_{P4}$, respectively, in absolute value. A p-type substrate of the NMOS transistors is tied to ground voltage $V_{SSIO}$, and an n-type substrate of the PMOS transistors is tied to predetermined supply voltage $V_{CCIO}$. The reference voltage $V_{refp}$ is ideally ⅓ $V_{CCIO}$, and reference voltage $V_{refn}$ is ideally ⅔ $V_{CCIO}$. Alternatively, $V_{refn}=V_{refp}=V_{CCIO}/2$.

For illustrative purposes, the gate oxide thickness is about 60 Å, and the gate oxide breakdown voltage is about 2.4–2.5 V. The voltage $V_{CCIO}$ equals about 3.3 V; the voltage $V_{SSIO}$ equals about 0 V or ground; $V_{refp}$ equals about 1.0 V; and the reference voltage $V_{refn}$ equals about 2.0 V. The threshold voltages, including body effect, of transistors $L_{P3}$, $L_{p1}$, $L_{N3}$ and $L_{P4}$ equal approximately 0.5 V. Hence, the final operating voltages $V_{p1}$, $V_{p2}$, $V_{p3}$ and $V_{p4}$ equal approximately 1.5 V. The output signal at output terminal OUT_LS switches from 0 V to 3.3 V, or vice versa, in response to a transition of the input signal at terminal IN from 2.0 V to 0 V, or vice versa.

Table 1, shown below, illustrates the final operating states of transistors $L_{N1}$–$L_{N3}$ and $L_{P1}$–$L_{p5}$, and the output signal at output terminal OUT_LS when the input signal at input terminal IN reaches 0 V or 2 V.

TABLE 1

| IN | $L_{N1}$ | $L_{N2}$ | $L_{N3}$ | $L_{P1}$ | $L_{P2}$ | $L_{P3}$ | $L_{P4}$ | $L_{P5}$ | OUT LS |
|---|---|---|---|---|---|---|---|---|---|
| 0 V | ON | OFF | OFF | ON | OFF | OFF | ON | ON | 3.3 V |
| 2.0 V | OFF | ON | ON | OFF | ON | ON | OFF | OFF | 0 V |

A predetermined time period is required for the input signal to switch from an initial voltage level of 2.0 (or 0 V) to a final voltage level of 0 V (or 2 V), and the output signal to switch from an initial voltage level of 0 V (or 3.3 V) to a final voltage level of 3.3 V (or 0 V). During this time, some of the transistors turn ON or OFF by themselves, and some of the transistors are driven ON or OFF due to the transitions of the input or output signals. Such switching operations protect the transistors, and prevent the voltage at any gate oxide from exceeding the gate oxide breakdown voltage.

During the transition of the input signal from 2.0 V to 0 V, the operation of level shifter 4' is as follows. The transistor $L_{N1}$ turns ON when a gate-source voltage $V_{gs}$ becomes greater than a threshold voltage $V_{tn1}$. The transistor $L_{N3}$ immediately turns OFF as the input signal switches to 0 V. The transistor $L_{N2}$ is initially ON until the voltage level at node NODE2 rises to predetermined voltage $V_{p2}$ of 1.5 V (i.e., $V_{refn}-V_{tn2}$) as the output signal rises from 0 V to 3.3 V. In other words, transistor $L_{N2}$ turns itself OFF to protect transistor $L_{N3}$ which is protected since there is only a voltage difference of 1.5 volts between the gate and drain of transistor $L_{N3}$.

Since the voltage level of 1.0 V is applied to the gate, transistor $L_{P1}$ is ON, and a conducting path is created between output terminal OUT_LS and the gate of transistor $L_{P3}$. As the output signal rises to 3.3 V, transistor $L_{P3}$ is forced OFF. Since transistors $L_{N1}$ and $L_{P2}$ are ON, the voltage level at node NODE1 discharges to predetermined voltage $V_{p1}$ of 1.5 V (i.e., $V_{refp}+V_{tp3}$), causing transistor $L_{P2}$ to turn OFF. The predetermined voltage $V_{p1}$ of 1.5 V appears on the gate of transistor $L_{P4}$, and transistor $L_{P4}$ turns ON. With $V_{refp}$ at 1.0 V, transistor $P_{L5}$ turns ON. The switching of transistor $L_{P2}$ from ON to OFF protects transistors $L_{P3}$ and $L_{P4}$ since there is now only a voltage difference of 1.8 V between the gate oxide.

A similar switching operation occurs when the input signal switches from 0 V to 2.0 V. The transistor $L_{N1}$ turns OFF since the gate-source voltage $V_{gs}$ will be 0 V, and transistor $L_{N3}$ will turn ON as the input signal rises to 2.0 V. The node NODE2 is pulled to ground, and transistor $L_{N2}$ turns ON such that terminal OUT_LS falls to 0 V. The transistor $L_{P1}$ is ON until the voltage level at node NODE3, which is conductively coupled to terminal OUT_LS, falls to predetermined voltage $V_{P3}$ of about 1.5 ($V_{refp}+V_{tp1}$). The transistor $L_{P3}$ turns ON in response to the predetermined voltage at node NODE3, and the voltage level at node NODE1 is raised to turn transistor $L_{P4}$ OFF. The transistor $L_{p5}$ stays ON until the voltage level at node NODE4 reaches predetermined voltage $V_{p4}$ of about 1.5 V ($V_{refp}+V_{tp4}$). At this point, there is only a voltage difference of 1.5 V between the gate and drain of transistor $L_{p5}$, i.e., transistor $L_{p4}$ protects transistor $L_{p5}$ from breaking down.

Figure 5:
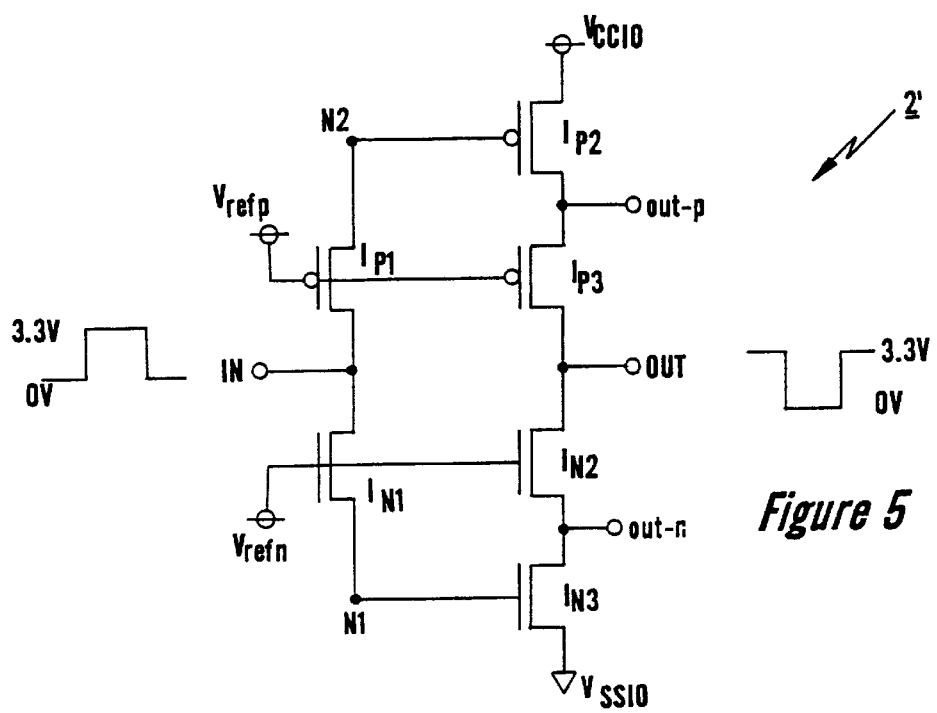
FIG. 5 is an illustration of a gate oxide protected inverter in accordance with an embodiment of the present invention.

Such an inventive aspect of the present invention can be also applied to a logic device. FIG. 5 is an illustration of a gate oxide protected inverter 2' in accordance with the present invention. The inverter 2' includes serially connected PMOS transistor $I_{P1}$ and NMOS transistor $I_{N1}$, and serially connected PMOS transistors $I_{P2}$, $I_{P3}$ and NMOS transistors $I_{N2}$, $I_{N3}$, which are connected to each other at nodes N1 and N2. The gates of transistors $I_{P1}$ and $I_{P3}$ are connected to reference voltage $V_{refp}$, and the gates of transistors $I_{N1}$ and $I_{N2}$ are connected to reference voltage $V_{refn}$. An input signal is applied to an input node/terminal IN located at an electrode connection between transistors $I_{P2}$ and $I_{N2}$ while an output signal is provided to an output node/terminal OUT at an electrode connection between transistors $I_{P3}$ and $I_{N2}$.

The transistor $I_{P2}$ includes a source connected to predetermined source voltage $V_{CCIO}$, e.g. 3.3 V, and a drain connected to a source of transistor $I_{P3}$, which includes a drain coupled to output terminal OUT. The drain of transistor $I_{N2}$ is also connected to output terminal OUT, and a source is connected to a drain of transistor $I_{N3}$. The source of transistor $I_{N3}$ is connected to predetermined voltage $V_{SSIO}$, e.g., 0 V or ground.

The source and drain of transistors $I_{P1}$ and $I_{N2}$ vary depending on whether the input signal is falling or rising. If the input signal is falling, node N1 and node N2 are, respectively, the drain and source of transistors $I_{N1}$ and $I_{P1}$. During the rise of the input signal, node N1 and node N2 are, respectively, the source and drain of transistors $I_{N1}$ and $I_{P1}$.

The transistors $I_{P1}$ and $I_{P3}$ and transistors $I_{N1}$ and $I_{N2}$ switch ON and OFF, or vice versa, to limit the drain voltages of transistors $I_{P2}$ and $I_{N3}$, respectively, when nodes N1, out_n, N2 and out_p reach predetermined voltages $V_{1n}$, $V_{2n}$, $V_{1p}$ and $V_{2p}$, where $V_{1n}=(V_{refn}-V_{tn1})$, $V_{2n}=(V_{refn}-V_{tn2})$, $V_{1p}=(V_{refp}+V_{tp1})$ and $V2p=(V_{refp}+V_{tp3})$, and Vtn1, $V_{tn2}$, Vtp1 and $V_{tp3}$ represent threshold voltages. The threshold voltages of all the transistors may be approximately equal, e.g., 0.5 V.

Table 2 illustrates the final operating states of transistors $I_{P1}$–$I_{P3}$ and $I_{N1}$–$I_{N3}$, and the output signal at output terminal OUT when the voltage level of the input signal reaches 0 V or 3.3 V.

TABLE 2

| IN | $I_{N1}$ | $I_{N2}$ | $I_{N3}$ | $I_{P1}$ | $I_{P2}$ | $I_{P3}$ | OUT |
|---|---|---|---|---|---|---|---|
| 3.3 V | OFF | ON | ON | ON | OFF | OFF | 0 V |
| 0 V | ON | OFF | OFF | OFF | ON | ON | 3.3 V |

As the input signal increases to 3.3 V, transistor $I_{N1}$ gradually turns OFF as the voltage level at node N1 reaches predetermined voltage $V_{1n}$ (1.5 V). The transistor $I_{P1}$ will turn ON while transistor $I_{P2}$ will be driven OFF due to the conductive path to input terminal IN receiving a rising input signal. Both transistors $I_{N2}$ and $I_{N3}$ are ON to drive the output signal at output terminal OUT to 0 V, but transistor $I_{P3}$ will turn itself OFF when node out_p reaches predetermined voltage $V_{2p}$ (1.5 V).

When the input signal falls to 0 V, transistor $I_{N1}$ will turn ON since the gate-source voltage $V_{gs}$ will be 2 V ($V_{refn}$–0), and drives node N1 to 0 V, which forces transistor $I_{N3}$ to turn OFF. The transistor $I_{P1}$ is initially ON, but will turn itself OFF when node N2 reaches predetermined voltage $V_{1p}$ (1.5 V), which is enough to turn transistor $I_{P2}$ ON. Since transistor $I_{P3}$ is turned ON, terminal OUT will be charged to 3.3 V. The transistor $I_{N2}$ will turn itself OFF when node out_n charges to predetermined voltage V2n (1.5 V).

Such operations protect the transistors such as transistors $I_{P2}$ and $I_{N3}$ from exceeding the breakdown voltage. For example, there is only a voltage difference of 1.5 V between node out_n and node N1 on the gate oxide of transistor $I_{N3}$, rather than 3.3 V. Similarly, the gate oxide of transistor $I_{P2}$ is protected since the voltage difference between predetermined source voltage $V_{CCIO}$ and node N2 is only about 1.8 V. Further, nodes out_p and out_n are protected outputs, meaning that the voltage swing at node out_p goes from approximately 1.5 V to 3.3 V, and the voltage swing at node output n goes from approximately 0 V to 1.5 V. The signals at these nodes can be directly hooked up to an output driver of an I/O buffer, thereby eliminating the need for additional transistors of a next inverter stage.

The present invention is not limited to a predetermined source voltage of 3.3 V, and is modifiable for connection with higher power rails. For example, if reference voltages $V_{refn}$ and $V_{refp}$ are changed to 2.5 V and 2.5 V in FIG. 5, inverter 2' can be connected to a power rail of 5.0 V. If the power rail is connected to a predetermined source voltage $V_{CCIO}$ of 3.3 V and reference voltages $V_{refn}$ and $V_{refp}$ are 1.65 V and 1.65 V, the present invention protects gate oxides whose maximum allowable voltage is as low as about 1.65 V. Generally, the lowest maximum allowable oxide voltage equals $V_{CCIO}$/2. The oxide protection scheme is applicable to other types of gates, such as NAND, NOR, XOR, etc. A family of "overvoltage logic" or "gate oxide protected logic" can be fabricated using the teachings of the present invention. FIGS. 6 and 7 are examples of an overvoltage NAND gate and an overvoltage NOR gate, respectively, using the oxide protection scheme of the present invention. A detailed description of the operation is omitted since one of ordinary skill in the art can readily appreciate the operation.

Figure 8:
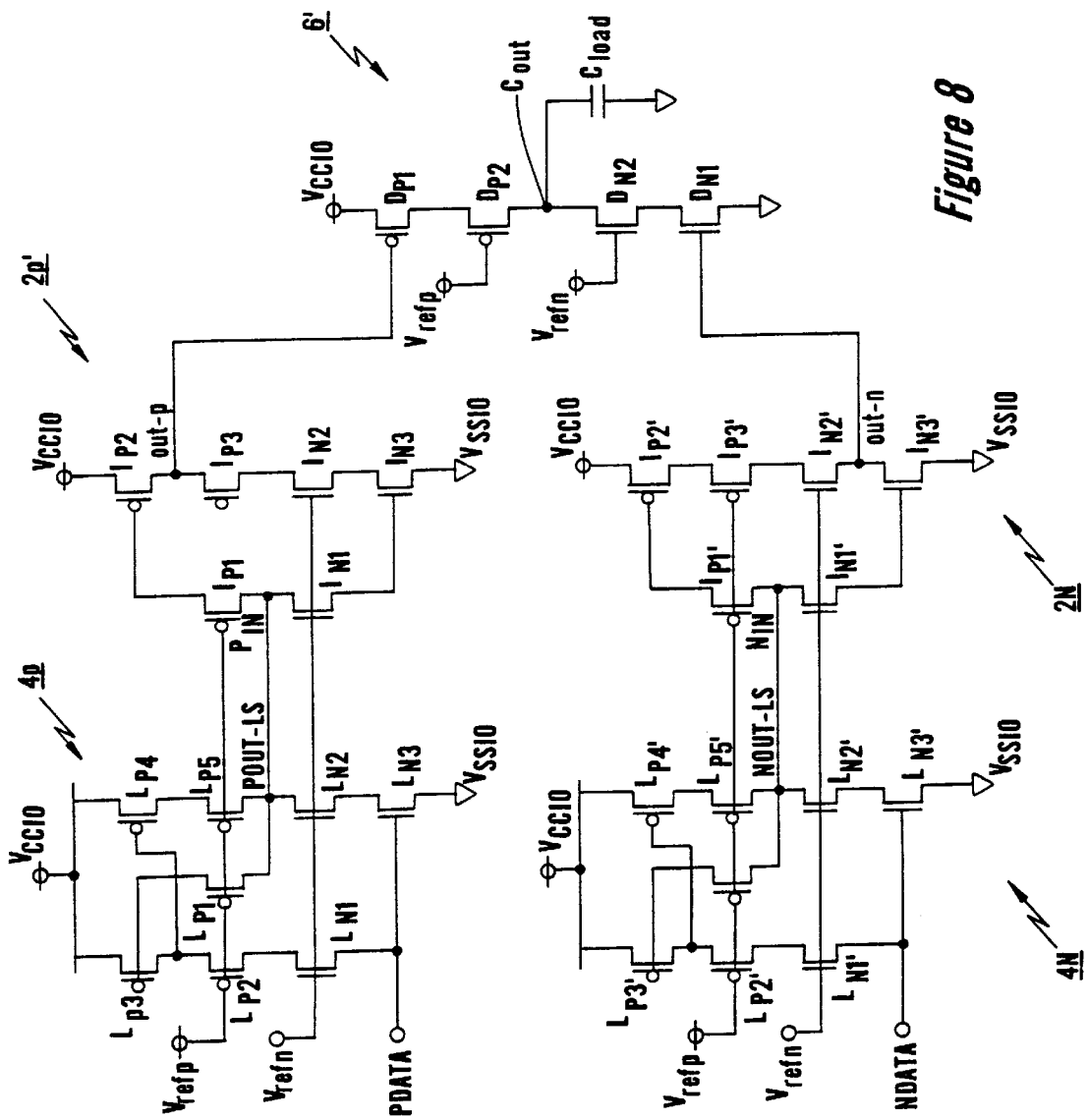
FIG. 8 is an illustration of a gate oxide protected input output buffer in accordance with the present invention.

FIG. 8 is an illustration of a gate oxide protected I/O buffer in accordance with the present invention. In addition to gate oxide protected level shifters $4_P$ and $4_N$ and inverters $2_P$ and $2_N$, the I/O buffer includes a gate oxide protected output driver circuit 6' comprising serially connected PMOS transistors $D_{P1}$ and $D_{P2}$ and NMOS transistors $D_{N1}$ and $D_{N2}$.

The source terminal of PMOS transistor $D_{P1}$ is connected to predetermined source voltage $V_{CCIO}$ while the source terminal of an NMOS transistor $D_{N1}$ is connected to ground voltage $V_{SSIO}$. A drain of transistor $D_{P1}$ is connected to a source of PMOS transistor $D_{P2}$, and a drain of transistor $D_{N1}$ is connected to a source of NMOS transistor $D_{N2}$. The drains of transistors $D_{P2}$ and $D_{N2}$ are connected to output node $C_{out}$ connected to a capacitative load $C_{load}$, where $C_{load}$ is representative of an off chip load.

The transistors $D_{P1}$ and $D_{P2}$ are the same size, i.e., the same transistor width and length. The same applies to transistors $D_{N1}$ and $D_{N2}$. Such sizing is optimal to prevent breakdown of the transistors caused by electrostatic discharge (ESD). If the sizes are different, high voltage and current stresses can find weakness in the way the disjointly sized transistors were fabricated.

The gates of transistors $L_{P1}$, $L_{P2}$, $L_{P5}$, $I_{P1}$, $I_{P3}$, $L_{P1}$, $L_{P2}$, $L_{P5}$, $I_{P1}$, $I_{P3}$, and $D_{P2}$ are connected to reference voltage $V_{refp}$, e.g., 1.0 V. The gates of transistors $L_{N1}$, $L_{N2}$, $I_{N1}$, $I_{N2}$, $L_{N1'}$, $L_{N2'}$, $I_{N1'}$, $I_{N2'}$ and $D_{N2}$ are connected to reference voltage $V_{refn}$, e.g., 2.0 V. The source terminals of transistors $L_{P3}$, $L_{P4}$, $I_{P2}$, $L_{P3}$, $L_{P4}$, and $I_{P2}$ are connected to power supply voltage $V_{CCIO}$, e.g., 3.3 V while the source terminals of transistors $L_{N3}$, $I_{N3}$, $L_{N3'}$ and $I_{N3'}$ are connected to ground voltage $V_{SSIO}$ (0 V).

The input terminals of the gate oxide protected level shifters $4_P$ and $4_N$ receive data signals PDATA and NDATA. The data signals PDATA and NDATA are generally the same voltage level, e.g., 0 V or 2.0 V, at a given time, and are generated by an internal device, such as a memory device or a microprocessor. The output terminals POUT_LS and NOUT_LS are connected to input terminals $P_{IN}$ and $N_{IN}$, respectively. The gate of transistor $D_{P1}$ is connected to inverter $2_P$ at node out_p while the gate of transistor $D_{N1}$ is connected to inverter $2_N$ at node out_n.

When data signals PDATA and NDATA switch to a high logic level, e.g, 2.0 V, a signal of about 0 V is generated at terminals POUT_LS, NOUT_LS, $P_{IN}$ and $N_{IN}$. In response, inverter $2_P$ outputs a signal of about 3.3 V at terminal out_p while inverter $2_N$ charges terminal out_n to a voltage level of about $V_{refn}$–$V_{tn2}$, e.g., about 1.5 V. A detailed description of each level shifter and inverter is omitted since the operations are the same as above for gate oxide protected level shifter 4' and inverter 2' of FIGS. 4 and 5, respectively.

In response to the signals at terminals out_p and out_n, transistors $D_{P1}$ and $D_{N1}$ turn OFF and ON, respectively. Since transistor $D_{N2}$ is ON, the output terminal $C_{out}$ is pulled to ground, and transistor $D_{P2}$ turns itself OFF when the voltage at the source reaches $V_{refp}$+$V_{tp}$, e.g., 1.5 V, where $V_{tp}$ is a threshold voltage of the PMOS transistor of the output driver circuit.

If data signals PDATA and NDATA switch to a low logic level, e.g., 0 V, a signal of about 3.3 V is generated at terminals POUT_LS, NOUT_LS, $P_{IN}$ and $N_{IN}$. In response, inverter $2_N$ outputs a signal of 0 V at terminal out_n while inverter $2_P$ discharges terminal out_p to a voltage level of about $V_{refp}$+$V_{tp3}$', e.g., 1.5 V. In response to the signals at terminals out_p and out_n, transistors $D_{P1}$ and $D_{N1}$ turn ON and OFF, respectively. Since transistor $D_{P2}$ is ON, output terminal $C_{out}$ is raised to about 3.3 V, and transistor $D_{N2}$ turns itself OFF when the voltage at drain reaches $V_{refn}$–$V_{tn}$, e.g, 1.5 V, where $V_{tn}$ is a threshold voltage of the NMOS transistor of the output driver circuit.

Unlike the prior art, the gate oxides of output driver circuit 6' are protected from exceeding the breakdown voltage. The transistors $D_{P2}$ and $D_{N2}$ protect transistors $D_{P1}$ and $D_{N1}$ while protecting themselves at the same time. For example, terminal out_n has a voltage swing of about 1.5 V ($V_{refn}-V_{tn2}$) to 0 V and the drain of transistor $D_{N1}$ has a voltage swing of about 0 V to 1.5 V ($V_{refn}-V_{tn}$), respectively. Hence, a voltage exceeding an oxide breakdown voltage of 2.4 V is prevented from being applied across the gate oxide of transistor $D_{N1}$.

To function as an input (i.e. to receive signals from an external source), driver 6' can be tristated so it doesn't drive $C_{OUT}$ either high or low. This occurs if PDATA is high (2.0 V) and NDATA is low (0 V). The node can then be driven from an external source, and NODE_EXT_IN can be fed into the core logic of the device. If voltage $V_{CC}$ of the core devices is equal to reference voltage $V_{ref}$ (for example, 2.0 V), a PMOS keeper may be used to restore full 0 V to 2 V levels on node NODE_EXT_IN.

The foregoing embodiment is merely exemplary and not to be construed as limiting the oxide protection scheme. The present oxide protection scheme can be readily applied to other digital circuits. One of ordinary skill in the art can use the teachings of the present invention to other devices requiring oxide protection. The description of the present invention is intended to be illustrative, and not limiting the scope of the claims. Many alternatives, modifications and variations will be apparent to those skilled in the art.

I claim:

1. An integrated circuit, comprising; first and second input nodes for respectively receiving first and second input signals, each having first and second levels, and an output node;

a first component, coupled between said first and second input nodes and said output node, and including an output driver circuit having first MOS transistor to provide an output signal of third and fourth levels to the output node in response to the first input signal of said first and second levels, respectively; and a protection device comprising at least one second MOS transistor interconnected with said first MOS transistor at a first node having a voltage level between one of (a) the third level and a first prescribed level and (b) the fourth level and a second prescribed level, to prevent voltages across gate oxide layers of said first and second MOS transistors from exceeding a prescribed magnitude, said output driver further including a third MOS transistor to provide the output signal of the fourth and third levels to the output node in response to the second input signal of said first and second levels, respectively, and said protection device further including a fourth MOS transistor coupled between said third transistor and said output node, said first MOS transistor and said third MOS transistor being controlled independently of each other by said first and second input signals, respectively, to enable said output driver to be turned off, and said first component further comprising first and second level shifters respectively coupled between said first and second input nodes and said first and third MOS transistors to control said first MOS transistor independently of controlling said third MOS transistor.

2. The integrated circuit of claim 1, wherein said first and second levels are voltage levels of 0 V and 2 V, respectively, and said third and fourth levels are voltage levels of 3.3 V and 0 V, respectively.

3. The integrated circuit of claim 1, wherein said level shifter further having a fifth MOS transistor for receiving a predetermined source voltage, and sixth and seventh MOS transistors being coupled to said input node, said second MOS transistor being coupled to said first MOS transistor, and said first node having a voltage level between said third level and said first prescribed level.

4. The integrated circuit of claim 3, wherein said second MOS transistor of said protection device is further coupled to said fifth MOS transistor at said first node.

5. The integrated circuit of claim 4, wherein said protection device further comprises:

an eighth MOS transistor coupled to said seventh MOS transistor at a second node and coupled to the output node, said eighth MOS transistor being turned OFF when said second node reaches said second prescribed level during a transition of the input signal from the second level to the first level.

6. The integrated circuit of claim 5, wherein said protection device further comprises:

a ninth MOS transistor coupled to said first MOS transistor at a third node, and coupled to the output node, and a tenth transistor coupled to said fifth MOS transistor at a fourth node and coupled to the output node, said ninth and tenth MOS transistors turning OFF when said third and fourth nodes reach third and fourth prescribed voltages, respectively, during a transition of the input signal from the first level to the second level.

7. The integrated circuit of claim 6, wherein control electrodes of second, ninth and tenth MOS transistor are coupled to a first reference voltage $V_{refp}$, and a control electrode of said eighth MOS transistor are coupled to a second reference voltage $V_{refn}$, and wherein said first, third and fourth prescribed voltages reach about $V_{refp}+V_t$ and said second prescribed voltage reaches about $V_{refn}-V_t$, where $V_t$ equals a threshold voltage of the MOS transistor.

8. The integrated circuit of claim 7, wherein said first and fifth MOS transistors are PMOS transistors, and sixth and seventh MOS transistors are NMOS transistors.

9. The integrated circuit of claim 1, wherein said first component comprises an inverter including a fifth MOS transistor, said protection device being coupled to said first and fifth MOS transistors.

10. The integrated circuit of claim 9, wherein said protection device further comprises a sixth MOS transistor coupled to said output node and coupled to said fifth MOS transistor at a second node, said second and sixth MOS transistors being turned OFF when said first and second nodes reach said first and second prescribed voltages, respectively, during a transition of the input signal from the second level to the first level.

11. The integrated circuit of claim 10, wherein said protection device further comprises:

a seventh MOS transistor coupled to said output node and coupled to said first MOS transistor at a third node; and an eighth MOS transistor coupled to said input node and coupled to said fifth MOS transistor at a fourth node, said seventh and eighth MOS transistors being turned OFF when said third and fourth nodes reach third and fourth prescribed voltages, respectively, during a transition of the input signal from the first level to the second level.

12. The integrated circuit of claim 11, wherein control electrodes of said second and seventh MOS transistors are adapted to be coupled to a first reference voltage $V_{refp}$, and control electrodes of said sixth and eighth MOS transistors are adapted to be coupled to a second reference voltage $V_{refn}$, and wherein said first and third prescribed voltages equal $V_{refp}+V_t$ and said second and fourth prescribed voltages equal $V_{refn}-V_t$, where $V_t$ equals a threshold voltage of the MOS transistor.

13. The integrated circuit of claim 12, wherein said first MOS transistor is a PMOS transistor, and said second MOS transistor is an NMOS transistor.

14. The integrated circuit of claim 1, wherein said second MOS transistor is turned OFF when said first node reaches said first prescribed voltage in response to a transition of said input signal from the first level to the second level.

15. The integrated circuit of claim 14, wherein said fourth MOS transistor coupled to said third MOS transistor at a second node is turned OFF when said second node reaches said second prescribed voltage in response to a transition of said input signal from the second level to the first level.

16. The integrated circuit of claim 15, wherein a control electrode of said second MOS transistor is supplied with a first reference voltage $V_{refp}$, and a control electrode of said fourth MOS transistor is supplied with a second reference voltage $V_{refn}$, and wherein said first prescribed voltage equals $V_{refp}+V_t$, and said second prescribed voltage equals $V_{refn}-V_t$, where $V_t$ equals a threshold voltage of a MOS transistor.

17. The integrated circuit of claim 16, wherein said first MOS transistor includes a control electrode receiving a first control signal varying between said third level and $V_{refp}+V_t$, and said third MOS transistor includes a control electrode receiving a second control signal varying between said first level and $V_{refn}-V_t$.

18. The integrated circuit of claim 1, wherein said first component comprises an input output (I/O) buffer, said buffer having a first inverter having a first transistor coupled to a first reference voltage $V_{ref1}$, said first inverter being coupled to said first level shifter;

said output driver circuit and first inverter being coupled to each other at a second node having a voltage level between said first level and at least one of $V_{ref1}-V_{t1}$ and $V_{ref1}+V_{t1}$, where $V_{t1}$ is a threshold voltage of said first transistor.

19. The integrated circuit of claim 18, wherein said first component further comprises a second inverter having a second transistor coupled to a second reference voltage $V_{ref2}$, said second inverter being coupled to said second level shifter, wherein said output driver circuit and said second inverter are coupled to each other at a third node having a voltage level between said second level and at least one of $V_{ref2}-V_{t2}$ and $V_{ref2}+V_{t2}$, where $V_{t2}$ is a threshold voltage of said second transistor.

20. The integrated circuit of claim 1, wherein said first component further comprises first and second inverters respectively coupled between said first and second level shifters and said first and third MOS transistors to control said first MOS transistor independently of controlling said third MOS transistor.

* * * * *

UNITED STATES PATENT AND TRADEMARK OFFICE
CERTIFICATE OF CORRECTION

PATENT NO.   : 5,892,371
DATED        : April 6, 1999
INVENTOR(S)  : Reading Maley It is certified that error appears in the above-identified patent and that said Letters Patent is hereby corrected as shown below:

On the Title Page, in the title, change "limiting" to --limited--.

Signed and Sealed this

Twenty-seventh Day of July, 1999

Attest:

Q. TODD DICKINSON

*Attesting Officer*   Acting Commissioner of Patents and Trademarks